United States Patent [19]
Womack

[11] Patent Number: 6,014,053
[45] Date of Patent: Jan. 11, 2000

[54] AMPLIFIER MOS BIASING CIRCUIT FOR A AVOIDING LATCH-UP

[75] Inventor: Richard H. Womack, Albuquerque, N.Mex.

[73] Assignee: Philips Electronics North America Corporation, New York, N.Y.

[21] Appl. No.: 08/854,711

[22] Filed: May 12, 1997

[51] Int. Cl.[7] .................................................. H03K 17/687
[52] U.S. Cl. ........................................... 327/538; 327/543
[58] Field of Search .................................. 327/530, 534, 327/535, 537, 543, 63, 65, 68, 74, 538

[56] References Cited

U.S. PATENT DOCUMENTS

| | | | |
|---|---|---|---|
| 5,371,419 | 12/1994 | Sundby | 327/543 |
| 5,402,375 | 3/1995 | Horiguchi et al. | 327/543 |
| 5,608,344 | 3/1997 | Marlow | 327/534 |

Primary Examiner—Tuan T. Lam
Attorney, Agent, or Firm—Brian J. Weighaus

[57] ABSTRACT

An amplified MOS biasing apparatus and method for avoiding latch-up within an integrated circuit. An amplifier receives a plurality of voltages and multiplies the voltages by a gain so as to generate a plurality of amplified voltages. A comparator compares the plurality of voltages and generates signals indicating which is greatest and which is smallest. A switch connects the greatest of the voltages to N-wells in PMOS transistors and connects the smallest of the voltages to P-wells in NMOS transistors to discourage parasitic diodes, within the PMOS and NMOS transistors, from conducting excessive amounts of current.

10 Claims, 6 Drawing Sheets

FIG. 6 ns of thousands. The

AMPLIFIER MOS BIASING CIRCUIT FOR AVOIDING LATCH-UP

BACKGROUND OF THE INVENTION

1. Field of the Invention

The present invention relates generally to biasing circuits, and more particularly to an amplified MOS biasing circuit for avoiding latch-up.

2. Discussion of Background Art

Parasitic diodes are typically formed when MOS devices are created within integrated circuits. For instance, in order to create PMOS transistors on a P-doped silicon substrate, N-doped "wells" must first be created within the substrate, then P-doped sources and drains are created within the wells. As is well known in the art, such a series of dopings creates two parasitic P-N diodes. The first diode is between the P-substrate and the N-well. The second diode is between the N-well and the P-source or P-drain. These parasitic transistors are also created when NMOS devices are formed within an N-doped silicon substrate.

When a PMOS transistor and an NMOS transistor are positioned side-by-side within an integrated circuit, a parasitic P-N-P-N Silicon Controlled Rectifier (SCR) circuit is created. As is well known in the art, parasitic SCRs in MOS transistor circuits can cause an undesirable condition called "latch-up." Latch-up occurs when the parasitic SCRs pass so much current that not only can't the integrated circuit's transistors be programmed, but also the integrated circuit could overheat and burn.

Designers typically have approached the latch-up danger either by keeping the parasitic diodes reverse biased or by placing guard-rings around each of the MOS transistors. When the diodes are reverse biased, current does not flow through them and the danger of creating a parasitic SCR is significantly reduced. To keep the parasitic diodes, within the PMOS transistor, reverse biased, the PMOS transistor's N-well must be kept at a higher voltage than the P-substrate, the P-source, and the P-drain. Since many integrated circuits, especially EPROMs, receive a plurality of different voltages, biasing circuits have been created for selecting and applying a maximum voltage to the N-well of the PMOS transistors in that integrated circuit. Note, for NMOS transistors the threat of latch-up is reduced by applying a minimum voltage to a P-well of the NMOS transistors.

These biasing circuits however, typically transition to a high-impedance state when the voltages they are comparing are almost equal. High-impedance results when all of the transistors in a biasing circuit are briefly turned off. Thus, instead of applying a maximum voltage to the N-well of a PMOS transistor, the N-well is allowed to float. When the N-well floats there is a much greater possibility that the PMOS transistor's parasitic diodes will forward bias and the integrated circuit will latch-up.

The other prior art approach toward reducing the danger of latch-up has been to place guard-rings around each of the MOS transistors. The guard-rings serve to isolate each PMOS transistor from its neighboring NMOS transistor and thus discourage parasitic SCRs from forming. However, guard rings consume additional space within an integrated circuit's already very limited area.

What is needed is an apparatus and method for avoiding latch-up in MOS based integrated circuits that addresses the prior art problems described above.

SUMMARY OF THE INVENTION

The present invention is an amplified MOS biasing circuit for avoiding latch-up within an integrated circuit. Within the apparatus of the present invention, an amplifier receives a plurality of voltages. The amplifier multiplies the voltages by a gain so as to generate a plurality of amplified voltages. A comparator compares the plurality of voltages and generates signals indicating which is greatest and which is smallest. A switch, under the control of the signals from the comparator, connects the greatest of the voltages to N-wells of PMOS transistors within the integrated circuit and connects the smallest of the voltages to P-wells of NMOS transistors within the integrated circuit. This discourages parasitic diodes, within the PMOS and NMOS transistors, from conducting excessive amounts of current.

While the comparator is only able to resolve two voltages within a fixed tolerance, amplification of the voltages before comparison effectively enables the comparator to resolve voltages differing by a much smaller amount. The present invention's higher precision thus reduces a risk of latch-up within the integrated circuit, since the greatest and least of the voltages can be applied to the N-well and the P-wells before the parasitic diodes in the transistors conduct significant amounts of current.

In another aspect of the invention, the amplifier and the comparator may be replaced with a differential amplifier which assumes their functions.

Within the method of the present invention, a first voltage and a second voltage are multiplied by a gain to create an amplified first voltage and an amplified second voltage respectively. The amplified first voltage is compared to the amplified second voltage to determine which is greater. The greater of the first and second voltages is connected to an N-well of an integrated circuit's PMOS transistors, so that parasitic diodes in the PMOS transistors are reverse biased. The smaller of the first and second voltages is connected to a P-well of the integrated circuit's NMOS transistors, so that its parasitic diodes are also reverse biased.

The circuit of the present invention is particularly advantageous over the prior art because the effective precision of the comparator can be increased by amplifying the voltages before they are compared.

These and other aspects of the invention will be recognized by those skilled in the art upon review of the detailed description, drawings, and claims set forth below.

DETAILED DESCRIPTION OF THE PREFERRED EMBODIMENT

Figure 1:
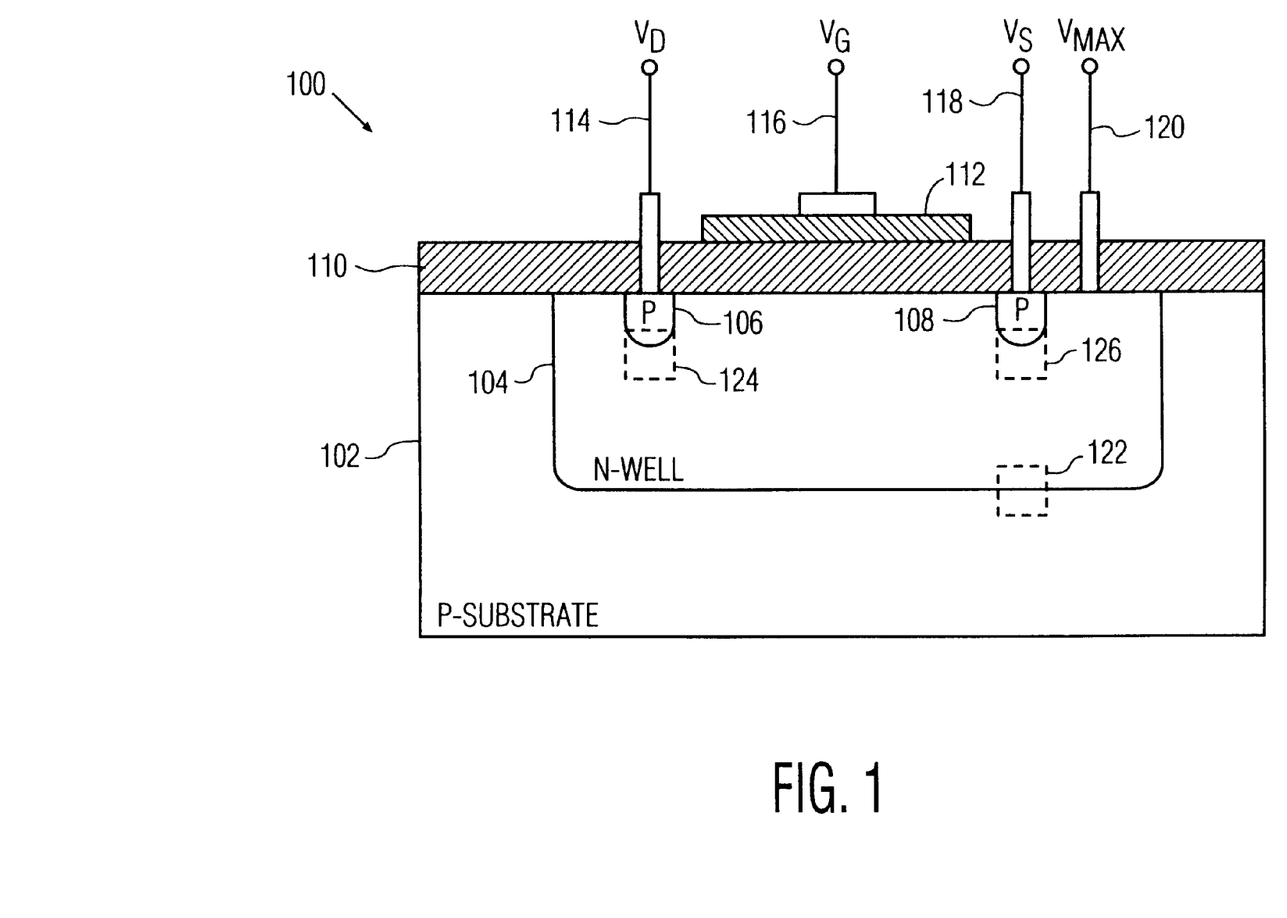
FIG. 1 is a cross-section of a PMOS transistor within a P-doped substrate.

FIG. 1 is a cross-section 100 of a PMOS transistor within a P-doped substrate 102. While only one PMOS transistor is shown, a typical integrated circuit contains thousands of PMOS and NMOS transistors in very close proximity. The cross-section 100 includes an N-well 104, a P-doped drain 106, an P-doped source 108, an insulator 110, a gate 112, a drain contact 114, a gate contact 116, a source contact 118, and a well contact 120. The well 104 is diffused into the substrate 102, forming a well-to-substrate parasitic diode 122 all along a boundary between the substrate 102 and the N-well 104. The drain 106 and source 108 are diffused into the well 104, forming a drain-to-well parasitic diode 124 and a source-to-well parasitic diode 126 all along a boundaries between the N-well 104, the drain 106, and the source 108. The insulator 110 covers the substrate 102, the well 104, the drain 106 and the source 108. The gate 112 is disposed over the insulator 112. The drain contact 114 is coupled to the drain 106, the gate contact 116 is coupled to the gate 112, the source contact 118 is coupled to the source 108, the well contact 120 is coupled to the well 120. A drain voltage ($V_D$) is coupled to the drain contact 114, a gate voltage ($V_G$) is coupled to the gate contact 116, a source voltage ($V_S$) is coupled to the source contact 118, and a maximum voltage ($V_{MAX}$) is coupled to the well contact 120. $V_{MAX}$ is the maximum voltage received by an integrated circuit containing the PMOS transistor, and keeps the parasitic diodes 122, 124, and 126 reverse biased. When the parasitic diodes 122, 124, and 126 are reverse biased, they do not conduct current and the threat of latch-up is reduced. In all other respects, those skilled in the art will recognize the cross-section 100 as that of an operable PMOS transistor. While the present invention is discussed with reference to the PMOS transistor, those skilled in the art will recognize that the present invention may also be applied to NMOS transistors.

Figure 2:
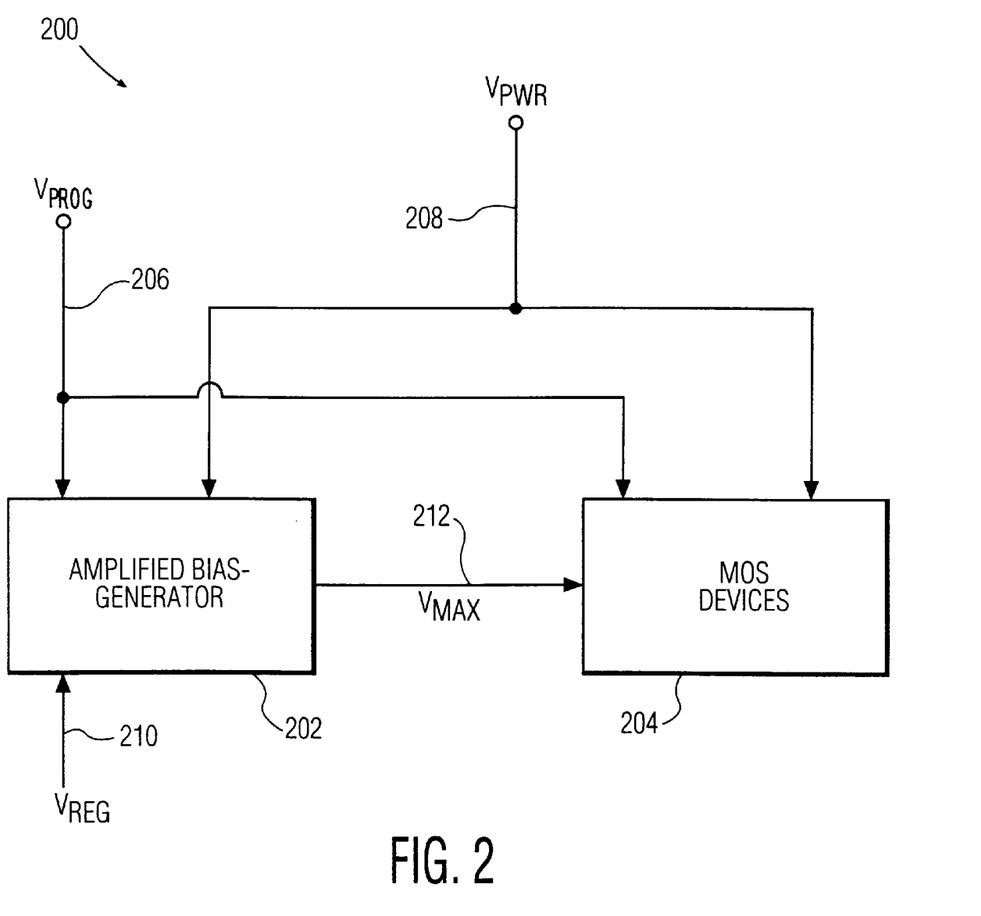
FIG. 2 is a block diagram of an amplified MOS biasing circuit for avoiding latch-up.

FIG. 2 is a block diagram of an amplified MOS biasing circuit 200 for avoiding latch-up. The circuit 200 includes an amplified bias-generator 202 and MOS devices 204. A programming voltage ($V_{PROG}$) is coupled via line 206 to the bias-generator 202 and the MOS devices 204. $V_{PROG}$ is used to program the MOS devices 204 and is set to either a high voltage (such as 11 Volts) or a low voltage (such as from 0 Volts to 5 Volts). A power supply voltage ($V_{PWR}$) is coupled via line 208 to the bias-generator 202 and the MOS devices 204. $V_{PWR}$ supplies power to the MOS devices 204 and is equal to a medium voltage (such as 5 Volts). A regulator voltage ($V_{REG}$) is coupled via line 208 to the bias-generator 202 for controlling the bias-generator 202 amplification. The bias-generator 202 passes $V_{MAX}$ to the MOS devices 204 via line 212. $V_{MAX}$ is a greater of either $V_{PROG}$ or $V_{PWR}$ and is coupled to the N-well contact 120 of every PMOS transistor within the MOS devices 204. When $V_{PROG}$ is greater than $V_{PWR}$ by a first pre-determined tolerance, then the amplified bias generator 202 sets $V_{MAX}$ equal to $V_{PROG}$. And, when $V_{PWR}$ is greater than $V_{PROG}$ by a second pre-determined tolerance, then the amplified bias generator 202 sets $V_{MAX}$ equal to $V_{PWR}$.

For the circuit 200 to avoid latch-up, the bias generator 202 must set $V_{MAX}$ so that the parasitic diodes 122, 124, and 126 in the PMOS transistors are either reverse biased or prevented from conducting significant amounts of current. In most real world devices, the parasitic diodes 122, 124, and 126 begin to conduct significant amounts of current after they are forward biased by about 0.6 Volts. Thus, $V_{MAX}$ may be not be more than 0.6 Volts less than a greater of either $V_{PROG}$ or $V_{PWR}$ else the parasitic diodes will conduct significant amounts of current. The first and second pre-determined tolerances discussed above are typically set equal to this 0.6 Volts, but each may be set to a different voltage should a circuit designer choose to skew the exact voltage where the bias-generator's sets $V_{MAX}$ equal to either $V_{PROG}$ or $V_{PWR}$.

Figure 3:
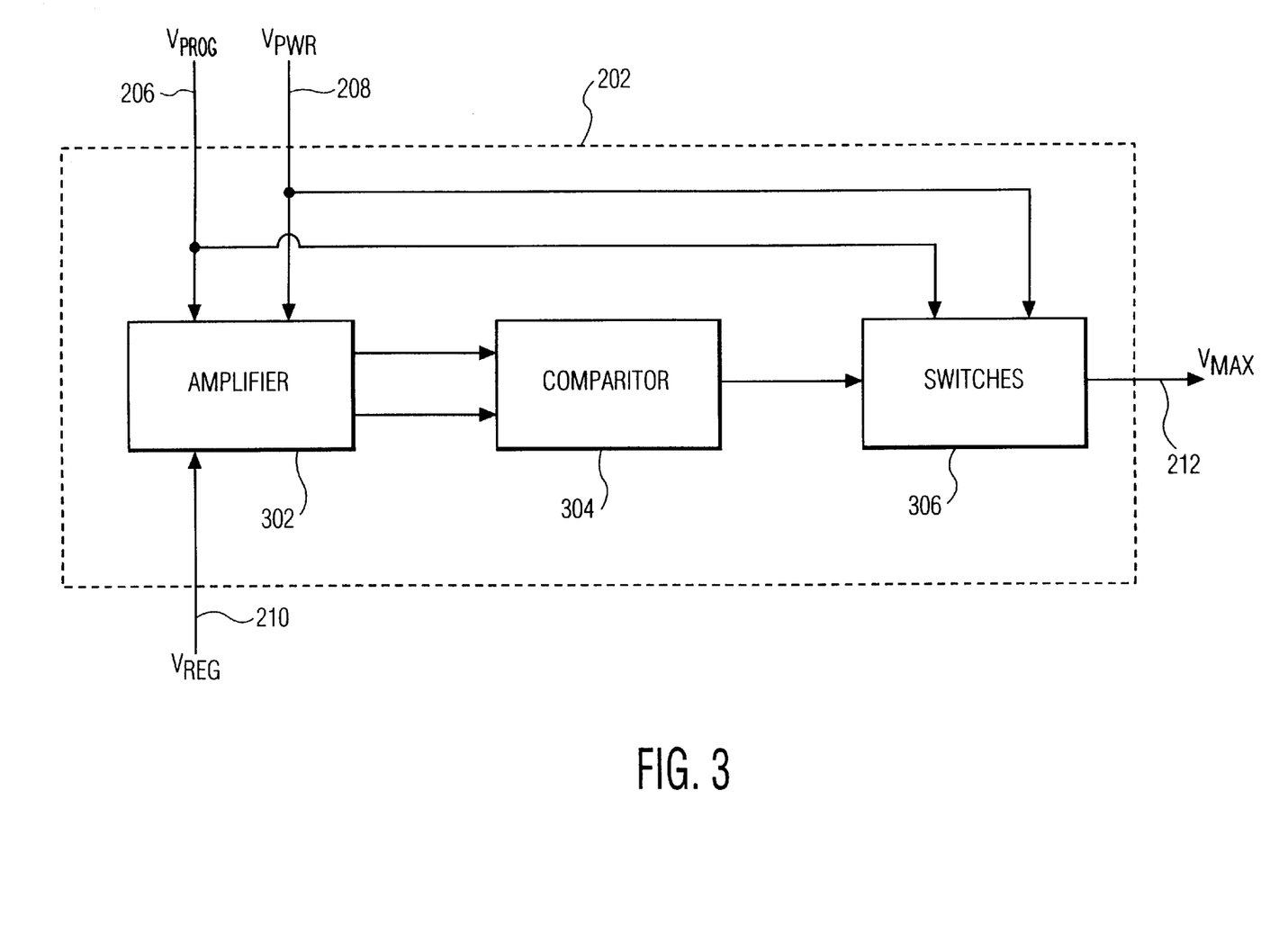
FIG. 3 is a block diagram of a first exemplary amplified bias generator.

FIG. 3 is a block diagram of a first exemplary amplified bias generator 202. The first exemplary bias-generator 202 includes an amplifier 302, a comparator 304, and switches 306. The amplifier 302 boosts $V_{PROG}$ and $V_{PWR}$ by an amount controlled by $V_{REG}$. The comparator's 304 compares the amplified $V_{PROG}$ to the amplified $V_{PWR}$ and commands the switches 306 to output the greater of the two voltages as $V_{MAX}$ on line 212.

Conventional comparators 304 are only capable of resolving differences of 0.9 Volt or more between two voltages. However, as discussed above, $V_{PROG}$ and $V_{PWR}$ must not be allowed to differ by more than 0.6 Volts. The present bias-generator 202 is able to resolve smaller differences between $V_{PROG}$ and $V_{MAX}$ because $V_{PROG}$ and $V_{MAX}$ are amplified by the amplifier 302 before being compared by the comparator 304. For example, if at a first time $V_{PROG}$=4 V and $V_{PWR}$=5 V, then the comparator 304 would set $V_{MAX}$=$V_{PWR}$ and the parasitic diodes 122, 124, 126 would be reverse biased. However, if at a second time $V_{PROG}$=5.7 V and $V_{PWR}$=5 V, then the comparator 304 would not have commanded the switch to set $V_{MAX}$=$V_{PROG}$ since the comparator 304 can't resolve the 0.7 V difference between $V_{PROG}$ and $V_{PWR}$. Thus, the parasitic diodes 122, 124, 126 would be forward biased by 0.7 V and would conduct significant amounts of current that could result in integrated circuit latch-up. However, with the amplifier 302 set to a gain of 2, then the amplified difference between $V_{PROG}$ and $V_{PWR}$ would equal 1.4 V and the comparator 304 could easily determine that $V_{PROG}$ is greater than $V_{PWR}$. Thus the comparator 304 would set $V_{MAX}$=$V_{PROG}$ and the parasitic diodes 122, 124, 126 would remain reverse biased.

Those skilled in the art will recognize that for NMOS transistors, a minimum voltage would be connected to either the P-substrate 102 or a P-well in each of the NMOS transistors. Typically, the minimum voltage on a integrated circuit is 0 V (i.e. ground).

Figure 4:
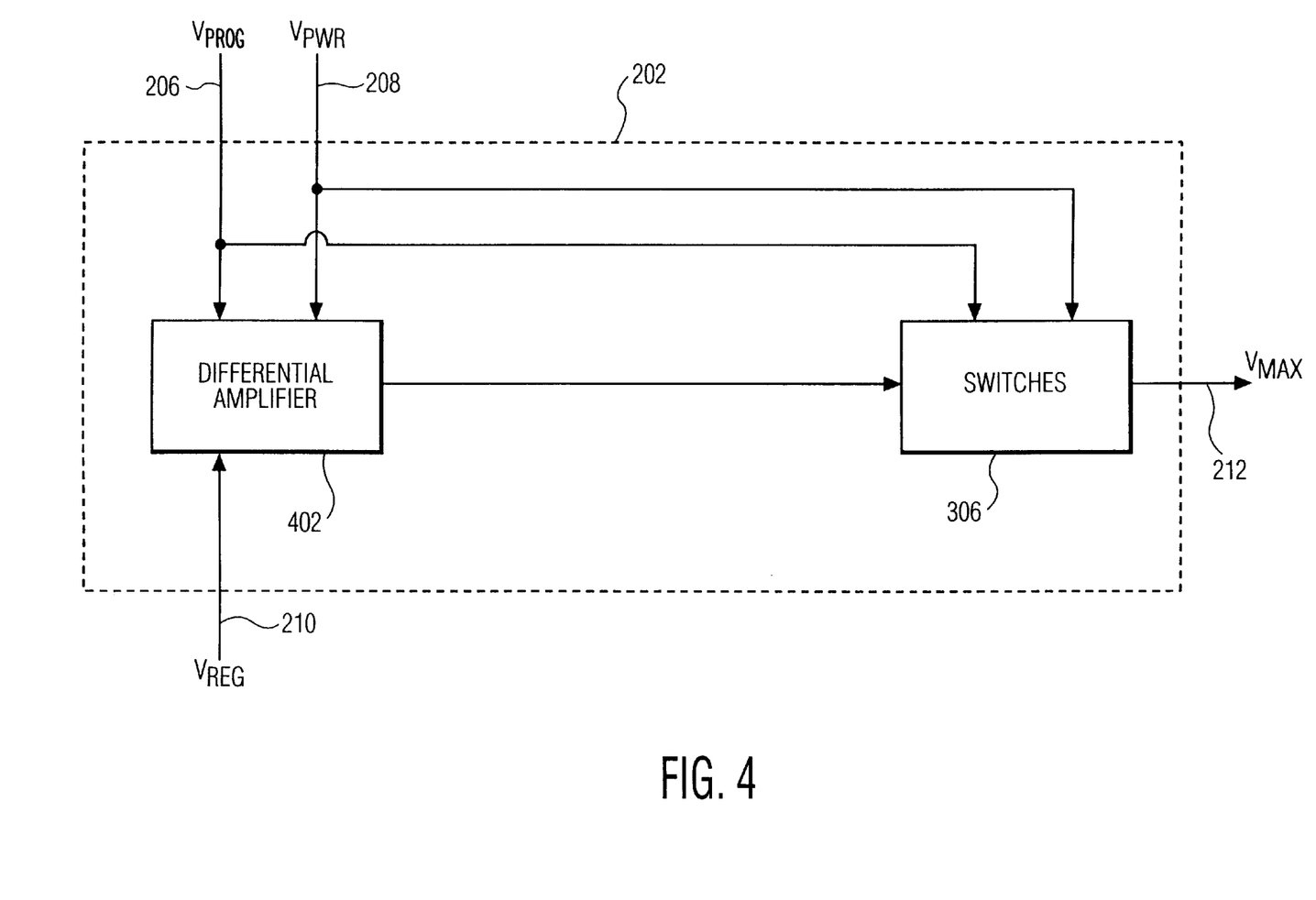
FIG. 4 is a block diagram of a second exemplary amplified bias generator.

FIG. 4 is a block diagram of a second exemplary amplified bias generator 202. The second exemplary amplified bias generator 202 includes a differential amplifier 402 and the switches 306. The differential amplifier 402 replaces the first exemplary amplified bias generator's amplifier 302 and comparator 304, but nevertheless operates in the same way and under the same constraints.

Figure 5:
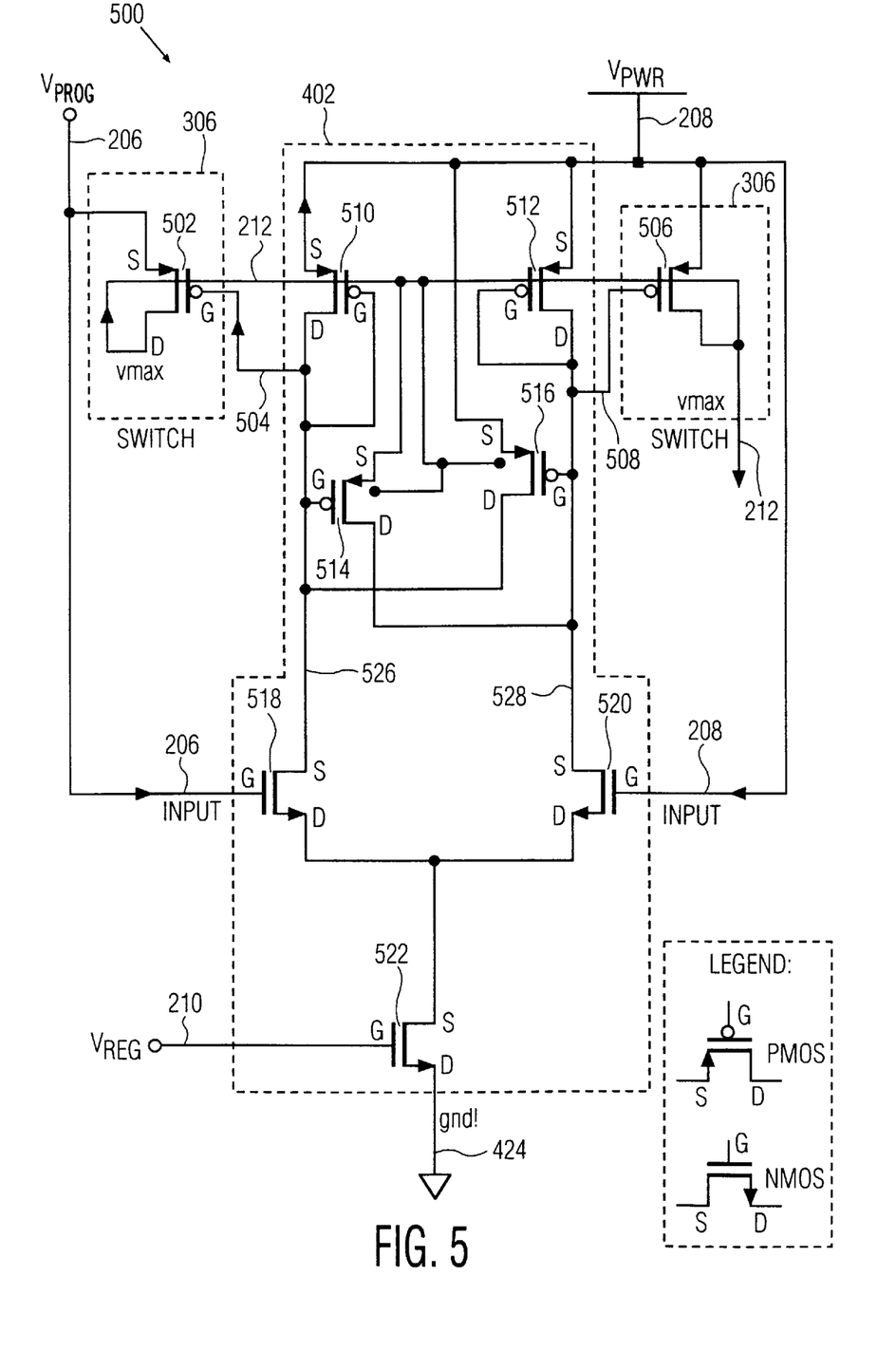
FIG. 5 is a circuit diagram of the second exemplary amplified bias generator.

FIG. 5 is a circuit diagram 500 of the second exemplary amplified bias generator 202. The circuit 500 includes the switches 306 and the differential amplifier 402. The switches 306 include PMOS transistor 502 for connecting $V_{PROG}$ on line 206 to $V_{MAX}$ on line 212 in response to a signal on line 504. The switches 306 also include PMOS transistor 506 for connecting $V_{PWR}$ on line 208 to $V_{MAX}$ on line 212 in response to a signal on line 508. The differential amplifier 402 includes four PMOS transistors 510, 512, 514, and 516 and three NMOS transistors 518, 520, and 522.

The N-well of each of the PMOS transistors is coupled to receive $V_{MAX}$ on line 212. Transistor 510's source is coupled to $V_{PWR}$ on line 208. Transistor 510's drain is coupled to the gate of transistor 502, 510, and 514, to the source of transistor 518, and to the drain of transistor 516. Transistor 512's source is coupled to $V_{PWR}$ on line 208. Transistor 512's drain is coupled to the gate of transistor 506, 512, and 516, to the source of transistor 520, and to the drain of transistor 514. Transistor 514's source is coupled to $V_{MAX}$ on line 212. Transistor 516's source is coupled to $V_{PWR}$ on line 208. Transistor 518's gate is coupled to $V_{PROG}$ on line 206 and transistor 518's drain is coupled the drain of transistor 520 and the source of transistor 522. Transistor 520's gate is coupled to $V_{PWR}$ on line 208. Transistor 522's drain is coupled to ground on line 524.

During operation, transistors 518 and 520 receive $V_{PROG}$ and $V_{PWR}$ respectively. If $V_{PROG}$ is greater than $V_{PWR}$ by the first predetermined tolerance, then transistor 518 turns on bringing the voltage on line 526 lower. When the voltage on line 526 is lower, then transistors 502 and 514 turn on. When transistor 502 is on $V_{MAX}$ is set to $V_{PROG}$. Transistor 510 functions as a resistor. When transistor 514 is on the voltage on line 528 is set to $V_{MAX}$. When the voltage on line 528 is set to $V_{MAX}$, then transistors 506, 512, and 516 turn off. When transistor 506 is off $V_{MAX}$ is not set to $V_{PWR}$. When transistor 512 is off the voltage on line 528 is not set to $V_{PWR}$. When transistor 516 is off the voltage on line 526 is not set to $V_{PWR}$.

If $V_{PWR}$ is greater than $V_{PROG}$ by the second predetermined tolerance, then transistor 520 turns on, bringing the voltage on line 528 lower. When the voltage on line 528 is lower, then transistors 506 and 516 turn on. When transistor 506 is on $V_{MAX}$ is set to $V_{PWR}$. Transistor 512 functions as a resistor. When transistor 516 is on the voltage on line 526 is set to $V_{MAX}$. When the voltage on line 526 is set to $V_{MAX}$, then transistors 502, 510, and 514 turn off. When transistor 502 is off $V_{MAX}$ is not set to $V_{PROG}$. When transistor 514 is off the voltage on line 528 is not set to $V_{MAX}$.

Figure 6:
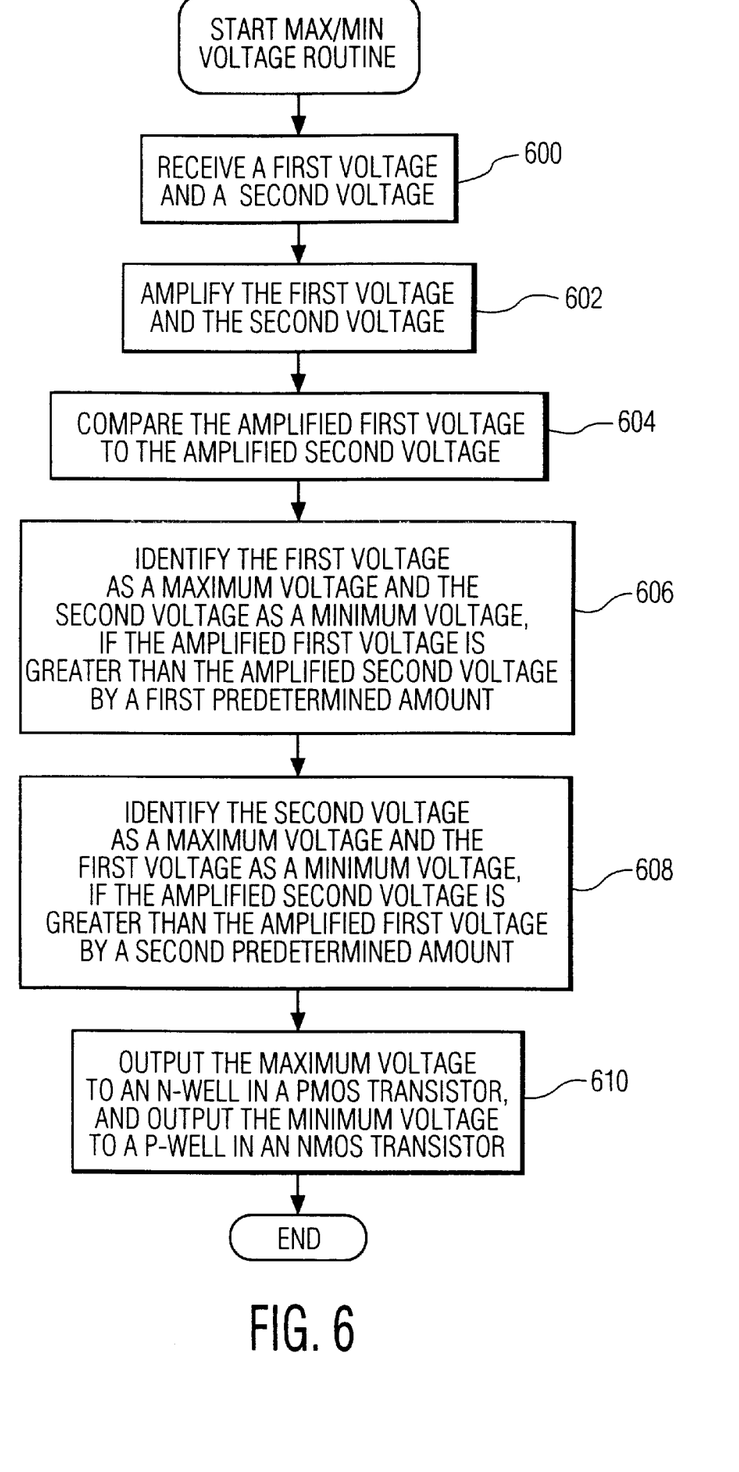
FIG. 6 is a flowchart for using amplification to avoid latch-up in a MOS based circuit.

FIG. 6 is a flowchart for using amplification to avoid latch-up in a MOS based circuit. The method begins in step 600 where the amplifier 302 receives a first voltage (i.e. $V_{PROG}$) and a second voltage (i.e. $V_{PWR}$). Next in step 602 the amplifier 302 amplifies the first voltage and the second voltage. The comparator 304 compares the amplified first voltage to the amplified second voltage in step 604. In step 606 the comparator 304 identifies the first voltage as a maximum voltage (i.e. $V_{MAX}$) and the second voltage as a minimum voltage, if the amplified first voltage is greater than the amplified second voltage by a first predetermined tolerance. Next in step 608 the comparator 304 identifies the second voltage as a maximum voltage and the first voltage as a minimum voltage, if the amplified second voltage is greater than the amplified first voltage by a second predetermined tolerance. The comparator 304 commands the switches 306 to output the maximum voltage on line 212 to an N-well in a PMOS transistor. Alternatively, the comparator 304 could have commanded the switches 306 to output the minimum voltage to a P-well in an NMOS transistor. After step 610 the method for using amplification to avoid latch-up in a MOS based circuit ends.

While the present invention has been described with reference to a preferred embodiment, those skilled in the art will recognize that various modifications may be made. Variations upon and modifications to the preferred embodiment are provided by the present invention, which is limited only by the following claims.

What is claimed is:

1. An apparatus for avoiding latch-up in a PMOS transistor having a source, an N-well, and a parasitic diode formed between the source and the N-well, comprising:

an amplifier, coupled to receive a first voltage and a second voltage, for generating an amplified first voltage and an amplified second voltage;

a comparator coupled to the amplifier, for comparing the amplified first voltage to the amplified second voltage, and generating a control signal indicating at least one of (i) whether the amplified first voltage exceeds the amplified second voltage by a first predetermined amplified tolerance and (ii) whether the amplified second voltage exceeds the amplified first voltage by a second predetermined amplified tolerance;

a switch coupled to the comparator and coupled to receive the first and second voltages, for coupling the greater of the first and second voltages to the N-well in response to the control signal, whereby the parasitic diode is reversed biased.

2. The apparatus of claim 1, wherein the first predetermined amplified tolerance is different from the second predetermined amplified tolerance.

3. The apparatus of claim 1, wherein the amplifier exhibits a gain and the first predetermined amplified tolerance equals a first predetermined non-amplified tolerance multiplied by the gain.

4. The apparatus of claim 3, wherein the gain is adjustable and the first predetermined amplified tolerance is variable by varying the gain.

5. The apparatus of claim 3, wherein the gain is set whereby the first predetermined non-amplified tolerance is substantially equal to a threshold turn-on voltage of the parasitic diode.

6. An apparatus for avoiding latch-up in an NMOS transistor having a source, a P-well, and a parasitic diode formed between the source and the P-well, the apparatus comprising:

an amplifier, coupled to receive a first voltage and a second voltage, for generating an amplified first voltage and an amplified second voltage;

a comparator coupled to the amplifier, for comparing the amplified first voltage to the amplified second voltage, and generating a control signal indicating which of the amplified first voltage and amplified second voltage is smaller than the other by a corresponding tolerance; and a switch coupled to the comparator and coupled to receive the first and second voltages, for coupling the smaller of the first and second voltages to the P-well in response to the control signal, whereby the parasitic diode is reverse biased.

7. A method for avoiding latch-up in a PMOS transistor comprising the steps of:

multiplying a first voltage and a second voltage by a gain to create an amplified first voltage and an amplified second voltage, respectively;

comparing the amplified first voltage to the amplified second voltage to determine which is greater, the step of comparing comprising the step of defining the first voltage as greater than the second voltage when the amplified first voltage exceeds the amplified second voltage by a predetermined amplified tolerance; and coupling the greater of the first and second voltages to an N-well in the PMOS transistor, whereby a parasitic diode in the PMOS transistor is reverse biased.

8. A method for avoiding latch-up in a NMOS transistor comprising the steps of:

multiplying a first voltage and a second voltage by a gain to create an amplified first voltage and an amplified second voltage respectively;

comparing the amplified first voltage to the amplified second voltage to determine which is smaller, the step of comparing including defining the amplified second voltage as smaller than the amplified first voltage when the amplified second voltage is smaller than the amplified first voltage by a predetermined tolerance; and coupling the smaller of the first and second voltages to a P-well in the NMOS transistor, whereby a parasitic diode in the NMOS transistor is reverse biased.

9. An apparatus for avoiding latch-up in a PMOS transistor having a source, an N-well, and a parasitic diode formed between the source and the N-well, the apparatus comprising:

means for multiplying a first voltage and a second voltage by a gain to create an amplified first voltage and an amplified second voltage respectively;

means for comparing the amplified first voltage to the amplified second voltage to determine which is greater, the step of determining including the step of defining the first voltage as greater than the second voltage when the first amplified voltage exceeds the second amplified voltage by a predetermined amplified tolerance; and means for coupling the greater of the first and second voltages to the N-well in the PMOS transistor, whereby the parasitic diode in the PMOS transistor is reverse biased.

10. An apparatus for avoiding latch-up in an NMOS transistor having a source, a P-well, and a parasitic diode formed between the source and the P-well, the apparatus comprising:

means for multiplying a first voltage and a second voltage by a gain to create an amplified first voltage and an amplified second voltage respectively;

means for comparing the amplified first voltage to the amplified second voltage to determine which is smaller, said means defining the amplified second voltage as smaller than the amplified first voltage when the amplified second voltage is smaller than the amplified first voltage by a predetermined tolerance; and means for coupling the smaller of the first and second voltages to the P-well in the NMOS transistor, whereby the parasitic diode in the NMOS transistor is reverse biased.

* * * * *